United States Patent [19]

White

[11] Patent Number: 5,126,575
[45] Date of Patent: Jun. 30, 1992

[54] METHOD AND APPARATUS FOR BROAD BEAM ION IMPLANTATION

[75] Inventor: Nicholas R. White, Warnham, England

[73] Assignee: Applied Materials, Inc., Santa Clara, Calif.

[21] Appl. No.: 693,784

[22] Filed: Apr. 29, 1991

Related U.S. Application Data

[63] Continuation of Ser. No. 510,330, Apr. 17, 1990, abandoned.

[51] Int. Cl.⁵ ............................................. H01J 37/304
[52] U.S. Cl. .............................. 250/492.3; 250/492.2; 250/398; 250/396 R; 250/396 ML
[58] Field of Search ........... 250/492.3, 492.21, 492.23, 250/397, 492.1, 398, 396 R, 396 ML

[56] References Cited

U.S. PATENT DOCUMENTS

| 3,676,693 | 7/1972 | Guerner | 250/492.21 |
|---|---|---|---|
| 3,845,312 | 10/1974 | Allison, Jr. | 250/492.21 |
| 4,191,887 | 3/1980 | Brown | 250/396 ML |
| 4,367,411 | 1/1983 | Hanley et al. | 250/492.2 |
| 4,578,589 | 3/1986 | Aiken | 250/492.21 |
| 4,633,138 | 12/1986 | Tokiguchi et al. | 250/492.21 |
| 4,733,091 | 3/1988 | Robinson et al. | 250/492.2 |
| 4,745,281 | 5/1988 | Enge | 250/492.21 |
| 4,785,188 | 11/1988 | Mori et al. | 250/398 |
| 4,812,663 | 3/1989 | Douglas-Hamilton et al. | 250/492.3 |
| 4,911,106 | 5/1990 | Berrian et al. | 250/398 |
| 4,914,305 | 4/1990 | Benveniste et al. | 250/492.21 |

FOREIGN PATENT DOCUMENTS 1389294 4/1975 United Kingdom .

OTHER PUBLICATIONS

J. H. Freeman, *Canal Rays to Ion Implantation*: 1886-1986, Radiation Effects, 1986, vol. 100, pp. 198-199.

D. W. Berrian, R. E. Kaim, J. W. Vanderport and J. F. M. Westendorp, *The ASM-220 Medium Current Implanter*, from Nuclear Instruments and Methods in Physics Research (NIMPR) b37/38 (1989), pp 500-503.

John P. Ruffel, D. H. Douglas-Hamilton and R. E. Kaim, *A High Current High Voltage Oxygen Ion Implanter*, NIMPR B21 (1987), pp. 229-234.

D. H. Douglas-Hamilton, John P. Ruffell and R. E. Kaim, *End Station Design Wafer Quality Control for a High Current Oxygen Implanter* NIMPR B21 (1987), pp. 324-327.

Primary Examiner—Jack I. Berman
Assistant Examiner—Kiet T. Nguyen
Attorney, Agent, or Firm—Douglas L. Weller

[57] ABSTRACT

A single aperture ion source is used to produce a ribbon shaped ion beam through which a target may be transported. At an aperture of the ion source the ion beam converges in a vertical direction and diverges in a horizontal direction. The ion beam is passed through the poles of an analyzing magnet. A waist of the ion beam in the vertical direction occurs at the analyzing magnet. The analyzing magnet causes the ion beam to converge in the horizontal direction. Immediately before the ion beam strikes the target, the ion beam is passed through a focussing magnet which renders the ion beam trajectories substantially parallel. Between the ion source and the target, the ion beam may be passed through one or more resolving slits, as necessary, to trim the ion beam and assure that a focused, uniform beam reached the target. At the target, the analyzing magnet projects an inverted image of the aperture of the ion source. Further, a cross section of the ion beam is in the shape of a ribbon, the length of the ribbon being wider than the target. Using a conveyer the target is passed through the ion beam resulting in a uniform implantation of ions.

10 Claims, 2 Drawing Sheets

METHOD AND APPARATUS FOR BROAD BEAM ION IMPLANTATION

This is a continuation of copending application Ser. No. 07/510,330 filed on Apr. 17, 1990 now abandoned.

BACKGROUND

The present invention is related to a broad beam ion implantation system in which an ion beam is used to achieve a uniform ion implant.

A work piece, typically a wafer composed of, for example, semiconductor material, metal or a thin film on a substrate may be doped by irradiating the work piece with an ion beam. Ion beam implantation allows for tight control over the purity of the doped species, over the concentration of doping and over the depth of the doping. For an overview of ion beam implantation techniques, see for example, U.S. Pat. No. 4,578,589 for Apparatus and Methods For Ion Implantation issued to Derek Aitken and U.S. Pat. No. 4,733,091 for Systems and Methods for Ion Implantation of Semiconductor Wafers issued to Frederick Robinson et al.

In the prior art, generally, an ion beam with a relatively small radius is used for implantation. The ion beam systematically scans the two dimensional surface of the work piece. Alternately the location of the ion beam may be fixed and the work piece systematically moved through the ion beam until the two-dimensional surface of the work piece has been scanned.

The above-discussed method of ion beam scanning works best when the work piece has a fairly small surface area. However, when, for example, an ion beam with a fixed source is scanned across an eight inch wafer in order to dope the wafer uniformly, the substantial variation of the angle at which the ion beam strikes the wafer makes it very difficult to achieve uniform processing across the entire width of the wafer.

At least one technique has been attempted to achieve greater processing uniformity by producing an ion beam which, across the width of the work piece in a first direction, consistently strikes the work piece perpendicular to the surface. In order to perform a complete scan, the work piece is mechanically moved in a direction perpendicular to the first direction. See U.S. Pat. No. 4,367,411 for Unitary Electromagnet for Double Deflection Scanning of Charged Particle Beam issued to Peter Hanley et al. and see also D. W. Berrian, R. E. Kaim, J. W. Vanderpot and J. F. M. Westendorp, *The ASM-220 Medium Current Implanter* in *Nuclear Instruments and Methods in Physics Research*, B37/38 (1989), pp. 500–503.

Further, ion implantation systems have been built which mechanically move a wafer through an ion beam which is wider than the wafer. In the prior art, multi-aperture ion sources have been utilized and the technique has been used only for applications where doping uniformity requirements are not precise. See John P. Ruffel, D. H. Douglas-Hamilton and R. E. Kaim, *A High Current, High Voltage Oxygen Ion Implanter* in *Nuclear Instruments and Methods in Physics Research*, B21 (1987), pp. 229–234 and see D. H. Douglas Hamilton, John P. Ruffell and R. E. Kaim, *End Station Design Wafer Quality Control for a High Current Oxygen Implanter*, in *Nuclear Instruments and Methods in Physics Research*, B21 (1987), pp. 324–327.

SUMMARY OF THE INVENTION

In accordance with the preferred embodiment of the present invention, a method and apparatus for irradiating a target with a fixed ion beam is presented. A single aperture ion source produces an ion beam. At an aperture of the ion source the ion beam converges in a vertical direction and diverges in a horizontal direction.

The ion beam is passed through the poles of an analyzing magnet. A waist of the ion beam in the vertical direction occurs at the analyzing magnet. The analyzing magnet causes the ion beam to converge in the horizontal direction.

Immediately before the ion beam strikes the target, the ion beam is passed through a focussing magnet which renders the ion beam trajectories substantially parallel. Between the ion source and the target, the ion beam may be passed through one or more resolving slits, as necessary, to trim the ion beam and assure that a focused, uniform beam reaches the target.

At or near the target, the analyzing magnet projects an inverted image in the long dimension of the aperture of the ion source. Further, a cross section of the ion beam is in the shape of a ribbon, the length of the ribbon being wider than the target. Using a conveyer the target is passed through the ion beam resulting in a uniform implantation of ions.

DESCRIPTION OF THE PREFERRED EMBODIMENT

Figure 1:
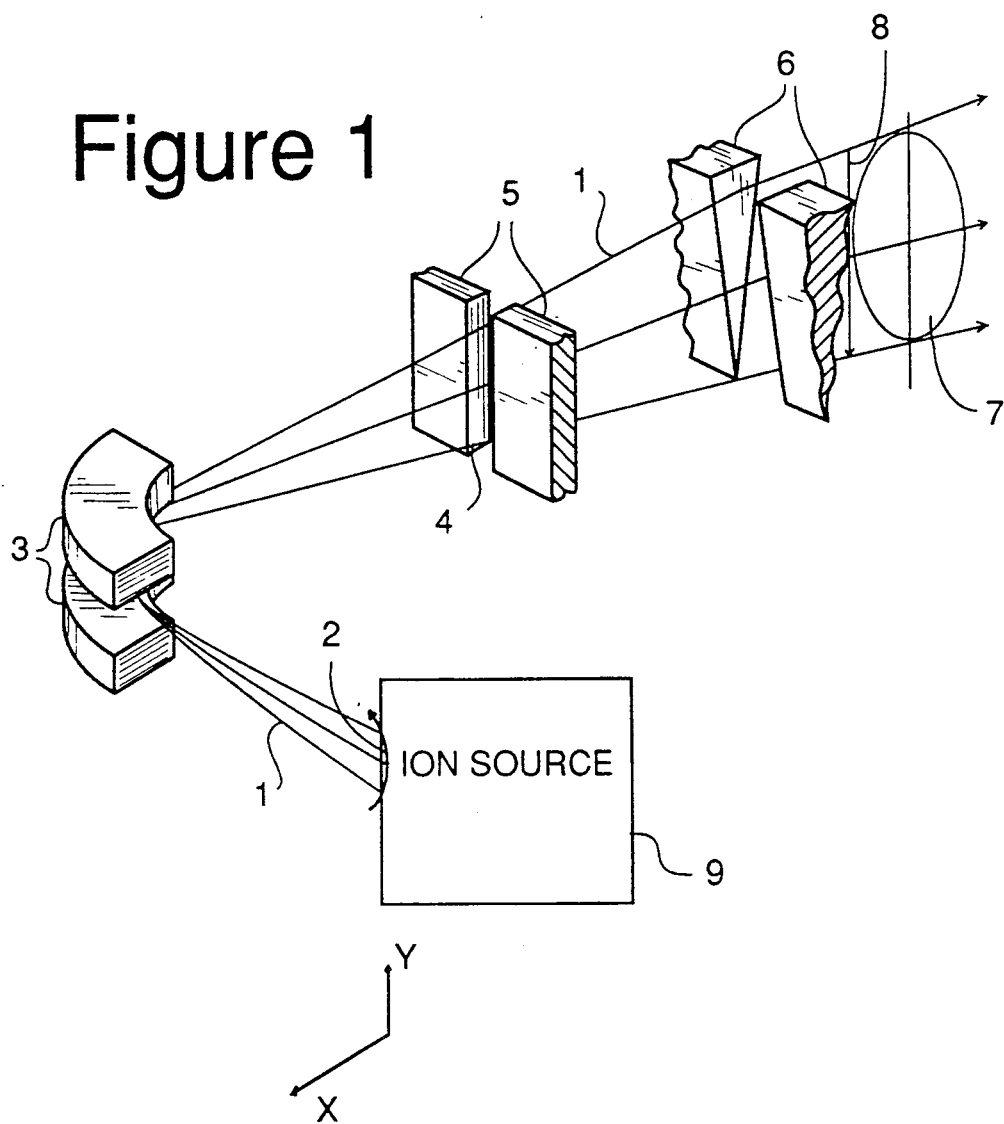
FIG. 1 shows an isometric view of an ion beam system according to the preferred embodiment of the present invention.

In FIG. 1, an ion beam 1 is produced by an ion source 9. Ion source 9 may be, for example a Freeman source. As a general reference see for example the discussion on ion sources in U.S. Pat. No. 4,578,589 for Apparatus and Methods For Ion Implantation issued to Derek Aitken. The ion beam current is typically 0.1 to 10 milliamps of ions at 2 to 80 keV. Although not shown, generally post-acceleration of ion beam 1 may be used to raise the energy to a typical level of 200 keV. Ion beam 1 is generated at a beam extraction aperture 2. Aperture 2 is generally slightly curved and typically is in the range of 60 to 90 millimeters high by 3 to 6 millimeters wide. In the preferred embodiment aperture 2 is 75 millimeters high and 3 millimeters wide. Beginning at aperture 2, ion beam 1 is convergent in the vertical (y) direction and divergent in the horizontal (x) direction.

Ion beam 1 passes between poles of an analyzing magnet 3. Analyzing magnet 3 deflects ion beam 1 at an angle which is 90 degrees or less, for example, in the preferred embodiment the angle is 90 degrees. The poles of analyzing magnet 3 are separated by a typical distance of 70 millimeters. The radius of trajectory of analyzing magnet 3 may typically be approximately 250 millimeters. The field produced is variable depending upon the type of ion and the energy of ion beam 1. Typically the field is in the range of 1 Tesla. The convergence in the vertical (y) direction is selected to produce a beam waist near the center of analyzing magnet 3. Generally, ion source 9 is approximately 400 millimeters from analyzing 3, although the distances between components of the system vary dependent on process parameters and sizes.

Ion beam 1 passes through a slit 4. Analyzing magnet 3 is typically in the range of 800 millimeters to 2500 millimeters from slit 4. Plates 5 on each side of slit 4 are constructed of refractory material, for example, one fourth inch stock of carbon. The beam optical properties of analyzing magnet 3 are chosen to bring the horizontal plane of ion beam 1 into focus at slit 4. For general information on magnet optics, see the methods presented by K. L. Brown in SLAC report 91, entitled *TRANSPORT/360: A Computer Program for Designing Charged Particle Beam Transport System*, as cited in U.S. Pat. No. 4,191,887 issued to K. L. Brown. See also N. R. White, *Computers and the Design of Ion Beam Optical Systems*, in *Nuclear Instruments and Methods in Physics Research*, B21 (1987), pp. 339-349. Slit 4 rejects ions from ion beam 1 which have inappropriate momentum. This is similar to what is done in conventional ion implanters and isotope separators.

Ion beam 1 then passes through poles of a wedge shaped magnet 6. Magnet 6 is typically about three meters from analyzing magnet 3. There is generally a gap of approximately 70 millimeters between the poles of wedge shaped magnet 6. The pole height of magnet 6 needs to be somewhat greater than that of the beam. Therefore, for a standard wafer of 300 millimeters, the pole height could be as large as 350 millimeters. Ion beam 1, when processing a wafer 300 millimeters in diameter, would typically be 320 millimeters high and 40 millimeters wide. Magnet 6 is arranged to bend ion beam 1 downwards by an average angle of about ten degrees. This focuses ion beam 1 into an approximately parallel beam.

After passing through the poles of wedge magnet 6, ion beam 1 impinges on a target 7. Target 7 is generally in the range of three to four meters from analyzing magnet 3. Typically, target 7 is a wafer, for example made out of silicon, on which it is desired to implant ions. At target 7, ion beam 1 is in the shape of a ribbon, for example 320 millimeters tall and 40 millimeters wide.

Figure 4:
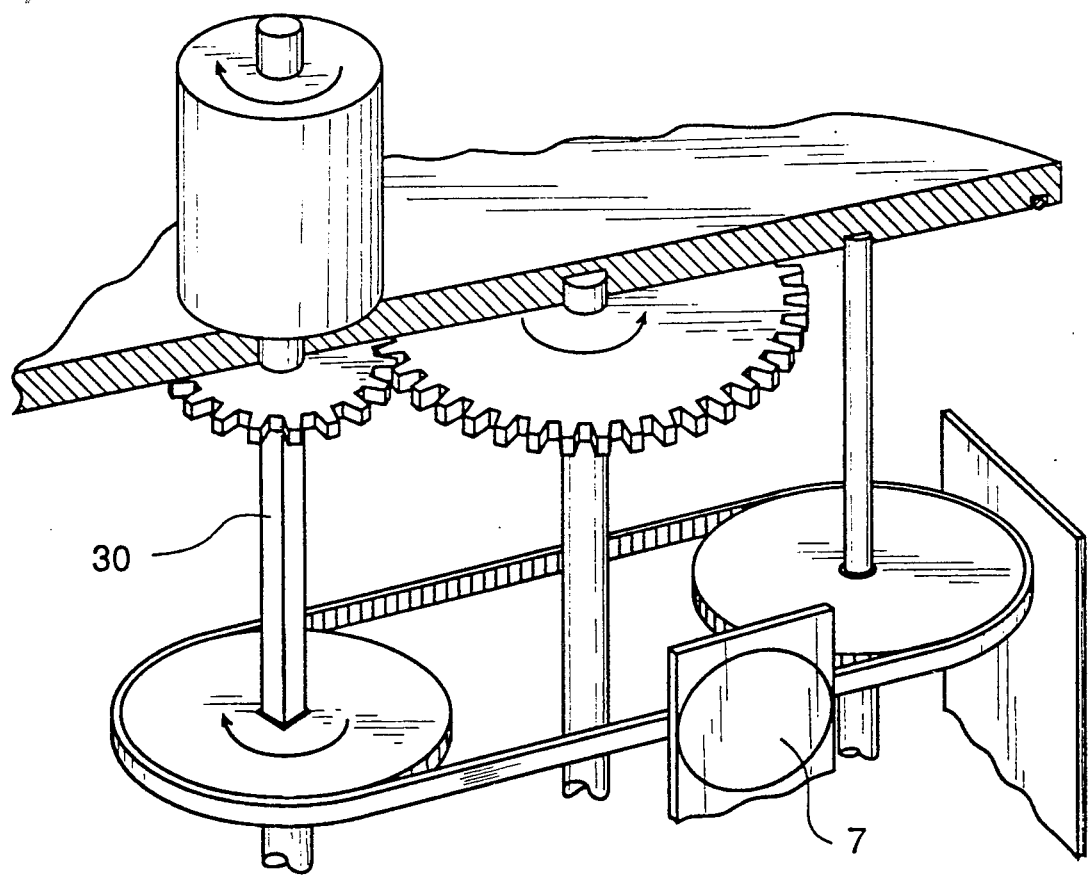
FIG. 4 shows a mechanical device which is used to move wafers and which is within the ion beam system shown in FIG. 1.

A mechanical device 30, shown in FIG. 4, is used to move target 7 side to side through ion beam 1 so to uniformly implant ions across the entire exposed front surface of target 7. For an example of implementation of mechanical device 30, see United Kingdom Patent 1,389,294 issued to Geoffrey Ryding for Improvements in or Relating to Target Chambers. The speed at which mechanical device 30 moves target 7 through ion beam 1 may be uniform or may be proportional to the ion current of ion beam 1. In the latter case, when the ion current increases, the speed at which target 7 moves through ion beam 1 is proportionally increased, thus insuring uniform density of implantation.

An arrow 8 schematically represents the position of an ion optical image which is the inverted image of ion beam 1 at extraction aperture 2. This image is ideally produced just in front of the surface of target 7.

If the optics of analyzing magnet 3 are without substantial aberration, the current density profile of ion beam 1 at the position of arrow 8 will be as uniform as the current density profile of ion beam at aperture 2. Systematic non-uniformity in ion beam 1 can be corrected by suitable profiling of plates 5. Such profiling may include subdividing plates 5 into smaller plates and providing adjustment mechanisms.

Figure 2:
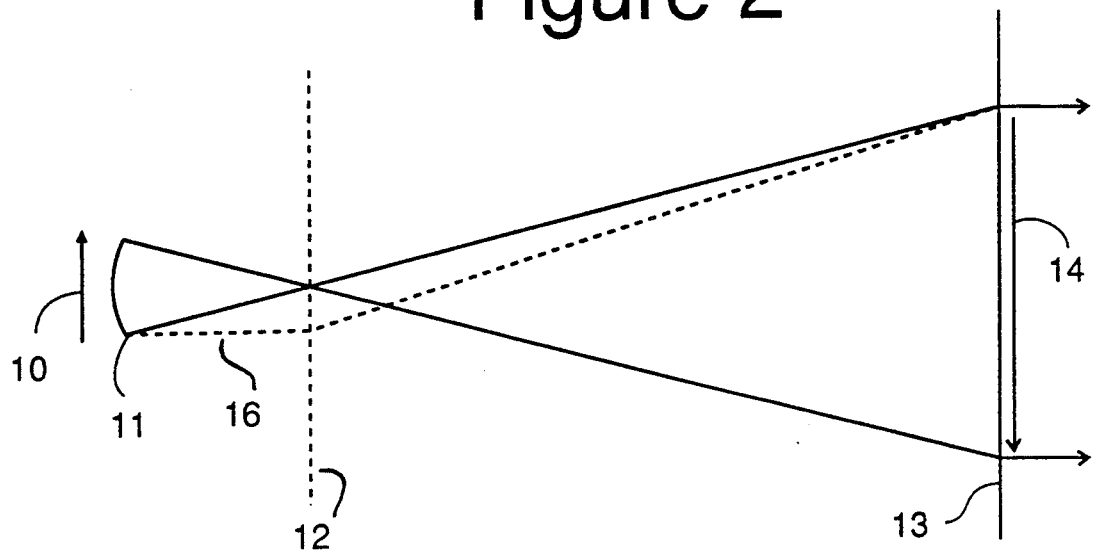
FIG. 2 illustrates how the ion beam system shown in FIG. 1 functions in the vertical (non-dispersive) plane.

FIG. 2 shows a profile of ion beam 1 in the vertical (convergent) plane. At a location 11, which is at ion source 9, ion beam 1 is converging. Location 12, at the center of analyzing magnet 3, is a vertical focal point of ion beam 12. Ion beam, in the vertical direction, then diverges until location 13, which is at magnet 6. An arrow 14 represents that at location 13, in the vertical direction, a cross section of ion beam 1 is an inverted image of a cross section of ion beam 1, represented by an arrow 10, at location 11 (aperture 2). A dashed line 16 represents an ion trajectory within ion beam 1 leaving ion source 9 at an angle somewhat different from the desired convergent trajectory. The action of analyzing magnet 3 in returning this trajectory to the desired location on the target is illustrated.

Figure 3:
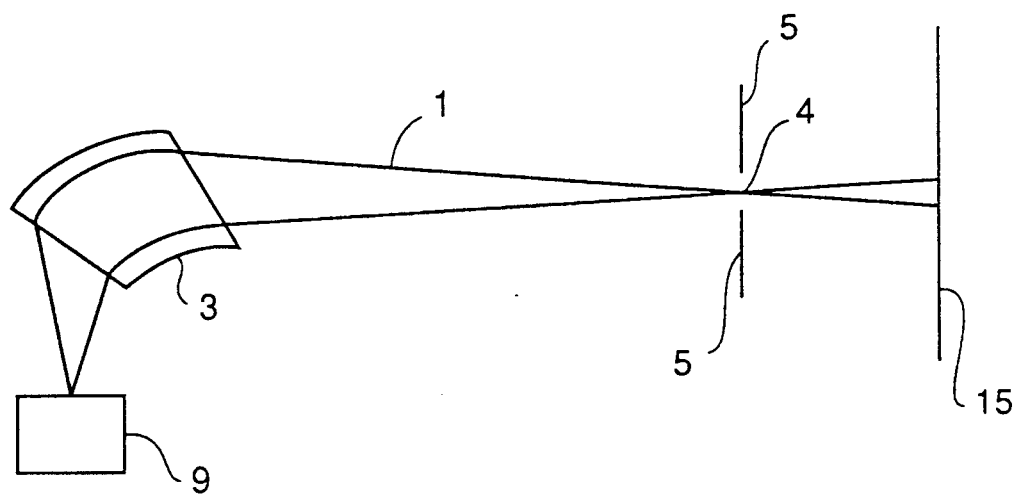
FIG. 3 illustrates how the ion beam system shown in FIG. 1 functions in the horizontal (dispersive) plane.

FIG. 3 shows a profile of ion beam in the horizontal (divergent) plane. Ion source 9 produces ion beam 1 so that ion beam 1 is divergent in the horizontal plane. Ion beam 1 is refocussed by analyzing magnet 3. Slit 4 is placed relatively close to a location 15 which is at target 7 in order that ion beam 1 is reasonably well focussed in the horizontal plane.

We claim:

1. A method for irradiating a target with an ion beam, the method comprising the steps of:
   (a) generating a substantially fixed ion beam using a single aperture ion source, a cross section of the ion beam having a length which is longer than the target, and a width which is substantially less than the length, the generating of the substantially fixed ion beam including the substeps of
      (a1) emitting the substantially fixed ion beam from an aperture in the single aperture ion source, the substantially fixed ion beam converging in a vertical direction and dispersing in a horizontal direction,
      (a2) passing the substantially fixed ion beam through poles of an analyzing magnet, a waist of the substantially fixed ion beam in the vertical direction occurring at the analyzing magnet and the analyzing magnet causing the substantially fixed ion beam to converge in the horizontal direction, and
      (a3) rendering the substantially fixed ion beam trajectories substantially parallel by passing the substantially fixed ion beam through a focussing magnet; and,
   (b) moving the target through the substantially fixed ion beam.

2. A method as in claim 1 wherein step (a) additionally comprises the substep of:
   (a4) passing the substantially fixed ion beam through at least one resolving slit.

3. A method as in claim 1 wherein in step (a) astigmatic optics parameters of the analyzing magnet are chosen so that an image of the aperture in the single aperture ion source is produced on the target.

4. A method as in claim 1 wherein in step (b) the target is moved through the substantially fixed ion beam at a uniform speed.

5. A method as in claim 1 wherein in step (b) the target is moved through the substantially fixed ion beam at a speed which varies proportionally to the ion current of the substantially fixed ion beam.

6. A system used for implanting ions in a target, the system comprising:
- ion beam generation means for generating an ion beam, the ion beam having a cross section with a length greater than the target and a width that is substantially less than the length, the ion beam means including a single aperture ion source, the ion beam generation means having
  - an analyzing magnet placed between the single aperture ion source and the conveyor means, the ion beam passing through poles of the analyzing magnet, a waist of the ion beam in the vertical direction occurring at the analyzing magnet and the analyzing magnet causing the ion beam to converge in the horizontal direction, and
  - a focussing magnet, placed between the analyzing magnet and the target, used for rendering the ion beam trajectories substantially parallel before the ion beam strikes the target; and,
- conveyor means, on which the target is placed, for transporting the target through the ion beam.

7. A system as in claim 6 additionally comprising:
- at least one resolving slit placed in the path of the ion beam between the ion source and the target.

8. A system as in claim 6 wherein astigmatic optics parameters of the analyzing magnet are chosen so that an image of an aperture in the single aperture ion source is produced on the target.

9. A system as in claim 6 wherein the conveyor means moves the target through the ion beam at a uniform speed.

10. A system as in claim 6 wherein the conveyor means moves the target through the ion beam at a speed which varies proportionally to ion current of the ion beam.

* * * * *